(12) United States Patent
Zilkie

(10) Patent No.: US 10,594,109 B2
(45) Date of Patent: Mar. 17, 2020

(54) DISCRETE WAVELENGTH TUNABLE LASER

(71) Applicant: Rockley Photonics Limited, London (GB)

(72) Inventor: Aaron Zilkie, Pasadena, CA (US)

(73) Assignee: Rockley Photonics Limited, London (GB)

(*) Notice: Subject to any disclaimer, the term of this patent is extended or adjusted under 35 U.S.C. 154(b) by 0 days.

(21) Appl. No.: 16/077,437

(22) PCT Filed: Feb. 17, 2017

(86) PCT No.: PCT/GB2017/050408
§ 371 (c)(1),
(2) Date: Aug. 10, 2018

(87) PCT Pub. No.: WO2017/141040
PCT Pub. Date: Aug. 24, 2017

(65) Prior Publication Data
US 2019/0052057 A1 Feb. 14, 2019

(30) Foreign Application Priority Data
Feb. 19, 2016 (GB) .................................. 1602947.2

(51) Int. Cl.
*H01S 5/125* (2006.01)
*H01S 5/026* (2006.01)
(Continued)

(52) U.S. Cl.
CPC ............ *H01S 5/125* (2013.01); *H01S 5/0268* (2013.01); *H01S 5/068* (2013.01); *H01S 5/124* (2013.01);
(Continued)

(58) Field of Classification Search
CPC ........ H01S 5/125; H01S 5/068; H01S 5/0268; H01S 5/50; H01S 5/124
See application file for complete search history.

(56) References Cited

U.S. PATENT DOCUMENTS 5,757,986 A 5/1998 Crampton et al.
6,014,480 A * 1/2000 Baney ................ G02B 6/29319
385/24
(Continued)

FOREIGN PATENT DOCUMENTS

EP 1 033 841 A2 9/2000
GB 2 386 778 A 9/2003
(Continued)

OTHER PUBLICATIONS

International Search Report and Written Opinion, corresponding to PCT/GB2017/050408, dated May 23, 2017, 15 pages.
(Continued)

*Primary Examiner* — Xinning(Tom) Niu
(74) *Attorney, Agent, or Firm* — Lewis Roca Rothgerber Christie LLP

(57) ABSTRACT

A discrete wavelength tunable laser having an optical cavity which comprises: a reflective semiconductor optical amplifier (SOA); a demultiplexer (Demux) having a single input and a plurality of outputs, the Demux configured to receive the output of the SOA and to produce a plurality of fixed spectral passbands within the gain bandwidth of the SOA; one or more tunable distributed Bragg reflector(s) (DBR(s)) arranged to receive the outputs of the Demux, each tunable DBR configured to select a reflective spectral band within the gain bandwidth of the SOA upon application of a bias current; wherein the SOA forms the back end mirror of the optical cavity; the one or more tunable DBRs form the front end mirror of the optical cavity; and wherein the lasing channel of the discrete wavelength tunable laser is chosen by
(Continued)

the overlap of the selected reflective spectral band of one of the one or more tunable DBRs with a fixed spectral passband of the Demux.

15 Claims, 7 Drawing Sheets

(51) Int. Cl.
  *H01S 5/14* (2006.01)
  *H01S 5/068* (2006.01)
  *H01S 5/12* (2006.01)
  *H01S 5/50* (2006.01)
  *H01S 5/40* (2006.01)

(52) U.S. Cl.
  CPC .............. *H01S 5/142* (2013.01); *H01S 5/50* (2013.01); *H01S 5/141* (2013.01); *H01S 5/4012* (2013.01); *H01S 5/4062* (2013.01)

(56) References Cited

U.S. PATENT DOCUMENTS

| | | | |
|---|---|---|---|
| 6,434,175 B1 | 8/2002 | Zah | |
| 6,801,702 B2 | 10/2004 | Day | |
| 6,950,450 B2 | 9/2005 | Simsarian et al. | |
| 8,548,334 B2* | 10/2013 | Mazed | H04B 10/272 398/140 |
| 8,818,208 B2 | 8/2014 | Zheng et al. | |
| 9,627,851 B1* | 4/2017 | Zilkie | H01S 5/042 |
| 2003/0086465 A1* | 5/2003 | Peters | G02B 6/12004 372/50.1 |
| 2004/0017604 A1* | 1/2004 | DiJaili | H01S 5/0265 359/341.41 |
| 2004/0033004 A1* | 2/2004 | Welch | B82Y 20/00 385/14 |
| 2004/0228564 A1* | 11/2004 | Gunn, III | G02B 6/12004 385/1 |
| 2005/0036739 A1 | 2/2005 | Doerr et al. | |
| 2005/0244994 A1* | 11/2005 | Meliga | B82Y 20/00 438/22 |
| 2011/0293279 A1* | 12/2011 | Lam | H04J 14/02 398/79 |
| 2013/0223844 A1 | 8/2013 | Hwang | |
| 2014/0133511 A1* | 5/2014 | Tanaka | H01S 5/0687 372/50.11 |
| 2015/0023382 A1 | 1/2015 | Schell et al. | |
| 2019/0341740 A1 | 11/2019 | Zilkie et al. | |

FOREIGN PATENT DOCUMENTS

| | | |
|---|---|---|
| JP | 2000-332693 A | 11/2000 |
| WO | WO 01/17073 A1 | 3/2001 |
| WO | WO 2016/045087 A1 | 3/2016 |

OTHER PUBLICATIONS

GB Search Report, corresponding to GB1602947.2, dated Aug. 30, 2016, 3 pages.

Lawniczuk, et al., "AWG-Based Photonic Transmitter With DBR Mirrors and Mach-Zehnder Modulators," IEEE Photonics Technology Letters, vol. 26, No. 7, Apr. 1, 2014, pp. 710-713.

Munoz, et al., "Multi-wavelength laser based on an Arrayed Waveguide Grating and Sagnac loop reflectors monolithically integrated on InP," Proceedings of the 15th European Conference on Integrated Optics, ECIO 2010, Apr. 6-9, 2010, Cambridge, United Kingdom, pp. 2.

Reid, et al., "A novel broadband DBR laser for DWDM networks with simplified quasi-digital wavelength selection," Thursday Afternoon / OFC 2002 / pp. 541-543.

Sanjoh, et al., "Multiwavelength Light Source with Precise Frequency Spacing Using a Mode-Locked Semiconductor Laser and an Arrayed Waveguide Grating Filter," IEEE Photonics Technology Letters, vol. 9, No. 6, Jun. 1997, pp. 818-820.

Simsarian, et al., "Fast Switching Characteristics of a Widely Tunable Laser Transmitter," IEEE Photonics Technology Letters, vol. 15, No. 8, Aug. 2003, pp. 1038-1040.

Simsarian, et al., "Less Than 5-ns Wavelength Switching With an SG-DBR Laser," IEEE Photonics Technology Letters, vol. 18, No. 4, Feb. 15, 2006, pp. 565-567.

Su, et al., "Improving the Switching Performance of a Wavelength-Tunable Laser Transmitter Using a Simple and Effective Driver Circuit," IEEE Photonics Technology Letters, vol. 16, No. 9, Sep. 2004, pp. 2132-2134.

Ward, et al., "Widely Tunable DS-DBR Laser With Monolithically Integrated SOA: Design and Performance," IEEE Journal of Selected Topics in Quantum Electronics, vol. 11, No. 1, Jan./Feb. 2005, pp. 149-156.

Whitbread, et al, "Digital wavelength selected DBR laser," Novel In-Plane Semiconductor Lasers II, Proceedings of SPIE vol. 4995, pp. 81-93.

Babaud, et al., "First Integrated Continuously Tunable AWG-Based Laser Using Electro-Optical Phase Shifters," Proceedings of the 12th European conference on Integrated Optics (ECIO '05) Apr. 6-8, 2005, Grenoble, France, pp. 156-159.

Keyvaninia, et al. "III-V-on-silicon multi-frequency lasers," Optics Express 13676, vol. 21, No. 11, Jun. 3, 2013, pp. 1-9.

Feng, Dazeng et al., "Compact single-chip VMUX/DEMUX on the silicon-on-insulator platform", Optics Express, Mar. 28, 2011, pp. 6125-6130, vol. 19, No. 7, Optical Society of America.

International Search Report and Written Opinion of the International Searching Authority, dated May 19, 2017, Corresponding to PCT/EP2017/053625, 16 pages.

U.K. Intellectual Property Office Search Report, dated Sep. 2, 2016, for Patent Application No. GB 1602950.6, 5 pages.

"UltraVOA SFP Module", Silicon Photonics Product Brief, 2014, pp. 1-2, Mellanox Technologies.

Zheng, D. W. et al., "Improved efficiency Si-photonic attenuator", Optics Express, Oct. 13, 2008, pp. 16754-16765, vol. 16, No. 21, Optical Society of America.

* cited by examiner

DISCRETE WAVELENGTH TUNABLE LASER

CROSS-REFERENCE TO RELATED APPLICATION(S)

This application is a National Phase Patent Application and claims priority to and the benefit of International Application Number PCT/GB2017/050408, filed on Feb. 17, 2017, which claims priority to British Patent Application Number 1602947.2, filed on Feb. 19, 2016; the entire contents of both of the documents identified in this paragraph are incorporated herein by reference.

FIELD OF THE INVENTION

The present invention relates to a discrete wavelength tunable laser, particularly to a discrete wavelength tunable laser having an optical cavity which includes a combination of a passive optical grating and one or more digital supermode-distributed Bragg reflector(s).

BACKGROUND OF THE INVENTION

Continuously tunable lasers are well-established and are commonplace in telecommunications applications. Although telecommunications lasers operate to fixed grids (eg ITU grids), tunable lasers need to be set up for a variety of applications and some extent of wavelength tunability is desirable to allow for correction of wavelength drift as the laser ages. Unfortunately, the requirement for full range continuous tunability results in expensive and power-hungry electronic circuitry, most particularly due to the requirement for digital-analog conversion (DAC) chips.

Distributed Feedback (DFB) lasers in which the gratings are built into the gain medium are being replaced by Distributed Bragg Reflector (DBR) lasers, particularly where tunability is required. For a wide range of tunability a Sampled Grating (SG) DBR laser is one typical option. In such a laser, the grating (often referred to as a "comb grating") gives rise to a comb of reflectivity peaks which can be tuned to select the required lasing wavelength.

In an alternative design of tunable laser, Digital Supermode DBRs (DS-DBRs) may be utilised. The DS-DBR design has the advantage over SG-DBR in that no DACs are required. However, tunable lasers made entirely on semiconductor chips have been impossible without gratings requiring DACs for control. For example, no tunable laser has been made with solely DS-DBR gratings (i.e. no other types of gratings). The challenge of this patent application is to create tunable lasers based upon the DS-DBR design principle but with cheaper and lower power consuming control electronics, in particular not requiring DACs. Semiconductor lasers, made absent DACs for primary control, are disclosed herein. This is achieved principally by devising finite state tunable devices.

The application of the AWG as a wavelength selective device for laser arrays is known (Keyvaninia et al, Optics Express, 21 (No 11) p 13675, 30 May 2013).

SUMMARY OF THE INVENTION

Accordingly, the present invention aims to solve the above problems by providing, according to a first aspect, a discrete wavelength tunable laser having an optical cavity which comprises: a semiconductor optical amplifier (SOA); a wavelength demultiplexer (Demux) having a single input and a plurality of outputs, the AWG configured to receive the output of the SOA and to produce a plurality of fixed spectral passbands within the gain bandwidth of the SOA; one or more tunable distributed Bragg reflector(s) (DBR(s)) arranged to receive the outputs of the Demux, each tunable-DBR configured to select a reflective spectral band within the gain bandwidth of the SOA upon application of a bias current; wherein the SOA forms the back end mirror of the optical cavity; the one or more tunable-DBRs form the front end mirror of the optical cavity; and wherein the lasing channel of the discrete wavelength tunable laser is chosen by the overlap of the selected reflective spectral band of one of the one or more tunable-DBRs with a fixed spectral passband of the Demux.

The one or more tunable-DBRs are configured to select a given spectral passband from the Demux which corresponds to the chosen mode of the laser (i.e. to the desired output of the wavelength) by reflecting the reflective spectral band which corresponds to the desired wavelength. The optical cavity of the tunable laser is therefore formed between a back end mirror on the SOA and a front end mirror formed by the one of the tunable DBRs to which a bias current is provided.

A single SOA can therefore provide the light for all channels of the tunable laser. This means that the wavelength tunable laser of the present invention achieves wavelength switching without the need for multiple SOAs. Unlike previous prior art examples where there exists a need to switch between multiple SOAs, there is no requirement in the tunable lasers described herein for complicated driving circuits to switch SOAs on and off. Instead, the entire tunable laser can be operated by a simple driving circuit which drives the one or more tunable DBRs directly.

Optional features of the invention will now be set out. These are applicable singly or in any combination with any aspect of the invention.

The Demux may take the form of any component suitable for demultiplexing the output of the SOA according to the wavelength. This Demux may take the form of an Arrayed Waveguide Grating (AWG). Other forms of Demux include: a Planar Concave Grating (PCG), a ring resonator array, an interleaver structure, a multimode interference device MMI, or a cascaded Mach Zehnder interferometer.

Each of the tunable DBRs may be a digital supermode distributed Bragg Reflector (DS-DBR).

Each of the one or more tunable DBRs may be a phase-tunable Distributed Bragg Reflector which preferably includes a phase tuning region, the carrier density of which can be manipulated by application of a current or voltage bias. The bias may be a forward bias or a reverse bias depending on the properties of the phase tuning region chosen. Adjusting the bias will in turn adjust the phase and position in frequency space of the reflectance spectrum or transmittance spectrum of that region of the DBR. The phase tuning region may be a portion of or all of the DBR.

Optionally, the phase tuning region includes a p-n junction device. In this way, the p-n junction device provides an electrically tunable phase tuning region whereby the phase of the reflectance spectrum of the DBR can be adjusted via carrier depletion by application of a varying reverse bias. The p-n junction may optionally be a p+–p–n–n+, or p++–p+–p–n–n+–n++ structure.

The AWG may be fabricated integrally with other waveguides on a single SOI chip. Alternatively, the AWG may be fabricated as a separate chip and aligned with other waveguides on the silicon chip during assembly.

The discrete wavelength tunable laser may include a single waveguide which optically couples the output of the SOA to the input of the AWG; and may include further waveguides, each of which is optically coupled to a respective output of the AWG; each of the further waveguides including a respective one of the one or more tunable DBRs.

In this way, the AWG receives light from the SOA via a single waveguide. The AWG then transmits light corresponding to each respective fixed spectral passband via a respective waveguide, each respective waveguide comprising a tunable DBR.

Optionally, the AWG is a 1×N AWG which splits the spectral output of the SOA into an integer number N of respective output waveguides; and the discrete wavelength tunable laser may include a further AWG which acts as a multiplexer to multiplex the signals from the N respective output waveguides to produce a common output of the laser.

Optionally, the AWG is a first 1×M AWG which splits the spectral output of the SOA into an integer number M of respective output waveguides; wherein the discrete wavelength tunable laser includes a further AWG which acts as a multiplexer to multiplex the signals from the M respective output waveguides to produce a common output of the laser; and wherein each respective waveguide includes one or more tunable DBRs the one or more tunable DBRs on each waveguide having a total number of P reflecting wavelength states.

Optionally, the AWG is a cyclic AWG wavelength router, having at least P cycles.

Optionally, the 1×M AWG has a channel spacing of $\Delta f$ and an FSR of $M\Delta f$.

Where the AWG is a 1×M cyclic router, the first output waveguide would receive spectral passbands from the AWG corresponding to wavelength values $\lambda_1$, $\lambda_{M+1}$, etc. up to $\lambda_{(P-1)M+1}$. The tunable DBR gratings on that waveguide will therefore be configured (by way of the grating separation) to reflect wavelength states with wavelength values $\lambda_1$, $\lambda_{M+1}$, etc. up to $\lambda_{(P-1)M+1}$. The second output waveguide would receive spectral passbands corresponding to wavelength values $\lambda_2$, $\lambda_{M+2}$, etc. up to $\lambda_{(P-1)M+2}$. The tunable DBR gratings on that waveguide will therefore be configured (by way of the grating separation) to reflect wavelength states with wavelength values $\lambda_2$, $\lambda_{M+2}$, etc. up to $\lambda_{(P-1)M+2}$. The final output waveguide (the $M^{th}$ output) would receive spectral passbands from the AWG corresponding to wavelength values $\lambda_M$, $\lambda_{2M}$, etc. up to $\lambda_{(P-1)M+M}$ (i.e. $\lambda_{PM}$). It can therefore be understood that the total number of discrete wavelength states that the tunable laser can be tuned to is given by M×P.

Optionally, the AWG is a non-cyclic 1×P AWG which splits the spectral output of the SOA into an integer number P of respective output waveguides; wherein the discrete wavelength tunable laser includes a further AWG which acts as a multiplexer to multiplex the signals from the P respective output waveguides to produce a common output of the laser; and wherein each respective waveguide includes one or more DS-DBRs the one or more tunable DBRs on each waveguide having a total number of M reflecting wavelength states.

Where this 1×P AWG is non-cyclic AWG, the first of the P output waveguides would receive spectral passbands from the AWG corresponding to wavelength values $\lambda_1$, $\lambda_2$, etc. up to $\lambda_M$. The tunable DBR gratings on that waveguide will therefore be configured (by way of the grating design) to reflect wavelength states with wavelength values $\lambda_1$, $\lambda_2$, etc. up to $\lambda_M$. The second output waveguide would receive spectral passbands corresponding to wavelength values $\lambda_{M+1}$, $\lambda_{M+2}$, etc. up to $\lambda_{2M}$. The tunable DBR gratings on that waveguide will therefore be configured (by way of the grating design) to reflect wavelength states with wavelength values $\lambda_{M+1}$, $\lambda_{M+2}$, etc. up to $\lambda_{2M}$. The final output waveguide (the $P^{th}$ output) would receive spectral passbands from the AWG corresponding to wavelength values $\lambda_{(P-1)M+1}$, $\lambda_{(P-1)M+2}$, etc. up to $\lambda_{(P-1)M+M}$ (i.e. $\lambda_{PM}$). As with the cyclic example, it can therefore be understood that the total number of discrete wavelength states that the tunable laser can be tuned to is given by M×P.

Optionally, the Arrayed Waveguide Grating (AWG) (i.e. the AWG which is configured to receive the output of the SOA and to produce a plurality of fixed spectral passbands within the gain bandwidth of the SOA) includes: a coarse tuning AWG in the form of a 1×P AWG, the coarse tuning AWG having one input which is optically coupled to the SOA and P outputs, the 1×P AWG configured to output a sub-region of the SOA spectral passband to each of its P respective outputs; a plurality of fine tuning AWGs, where each fine tuning AWG is a 1×M AWG; the input of each of the 1×M AWG being optically coupled to one of the P respective outputs of the 1×P AWG; M output waveguides respectively coupled to the M outputs of each fine tuning AWG to give a total of M×P output waveguides from the 1×M AWGs; and a further AWG which acts as a multiplexer to multiplex the signals from the M×P respective output waveguides to produce a common output of the laser; wherein each of the M output waveguides of each of the fine tuning AWGs comprises a tunable DBR grating.

Optionally, the discrete wavelength tunable laser of claim 1, further comprises additional P SOAs and additional P AWGs such that the tunable laser includes: a plurality of SOAs and a plurality 1×M AWGs, the output of each SOA providing an input to a 1×M AWG; a plurality M of output waveguides optically coupled to the respective M outputs of each 1×M AWG, wherein each of the M outputs of each 1×M AWG includes a tunable DBR grating. Optionally, each 1×M AWG may have a channel spacing of $\Delta f$ and an FSR of $M\Delta f$.

It is envisaged that the AWG could be replaced by any other passive optical component configured to produce a comb-like transmittance spectrum. For example, suitable alternatives could include a ring resonator, a waveguide Fabry-Perot filter or a Multimode Interference (MMI) device configured to act as a Fabry-Perot filter.

It is also envisaged that the tunable DBRs (which may take the form of DS-DBRs) could be adapted to compensate for the spectral profile of the gain medium. The gain element will have a large spectral range over which the power of light generated will depend upon the wavelength. Usually there will be less power at the two extremes of the spectral range, creating a "drop off" in power at the edges of the range. The DBRs could be adapted to compensate for such drops in gain. For example, the reflectivity of the DBR could be reduced at parts of the DBR which correspond to high-gain regions of the spectral profile of the gain medium. Alternatively, or in addition, the reflectivity of DBRs could be increased at sections configured to reflect wavelengths which correspond to spectral regions of low-gain from the gain medium.

Optionally, for any one of the aspects above, the discrete wavelength tunable laser may further comprise one or more phase tuner(s) for fine tuning the wavelength of the laser.

This phase tuner would be separate from any phase tuners that may form part of the tunable DBR(s). The fine tuning phase tuner may be used to account for drift due to temperature or other environmental factors.

In any of the embodiments described herein, said mirror located at the back end of the semiconductor gain medium may preferably have a reflectivity of at least 85% and even more preferably, the mirror has a reflectivity of at least 90%. A standard high reflectivity coating may be applied to give the desired reflectivity over the desired bandwidth.

In some embodiments, the SOA (Semiconductor Optical Amplifier) is an RSOA (Reflective Semiconductor Optical Amplifier). In this way, the RSOA forms the back mirror of the optical cavity.

Further optional features of the invention are set out below.

BRIEF DESCRIPTION OF THE DRAWINGS

Embodiments of the invention will now be described by way of example with reference to the accompanying drawings in which:

FIG. 1b shows a schematic diagram of spectral profiles of the AWG and DBR gratings of the embodiment shown in FIG. 1a;

DETAILED DESCRIPTION AND FURTHER OPTIONAL FEATURES OF THE INVENTION

Figure 1A:
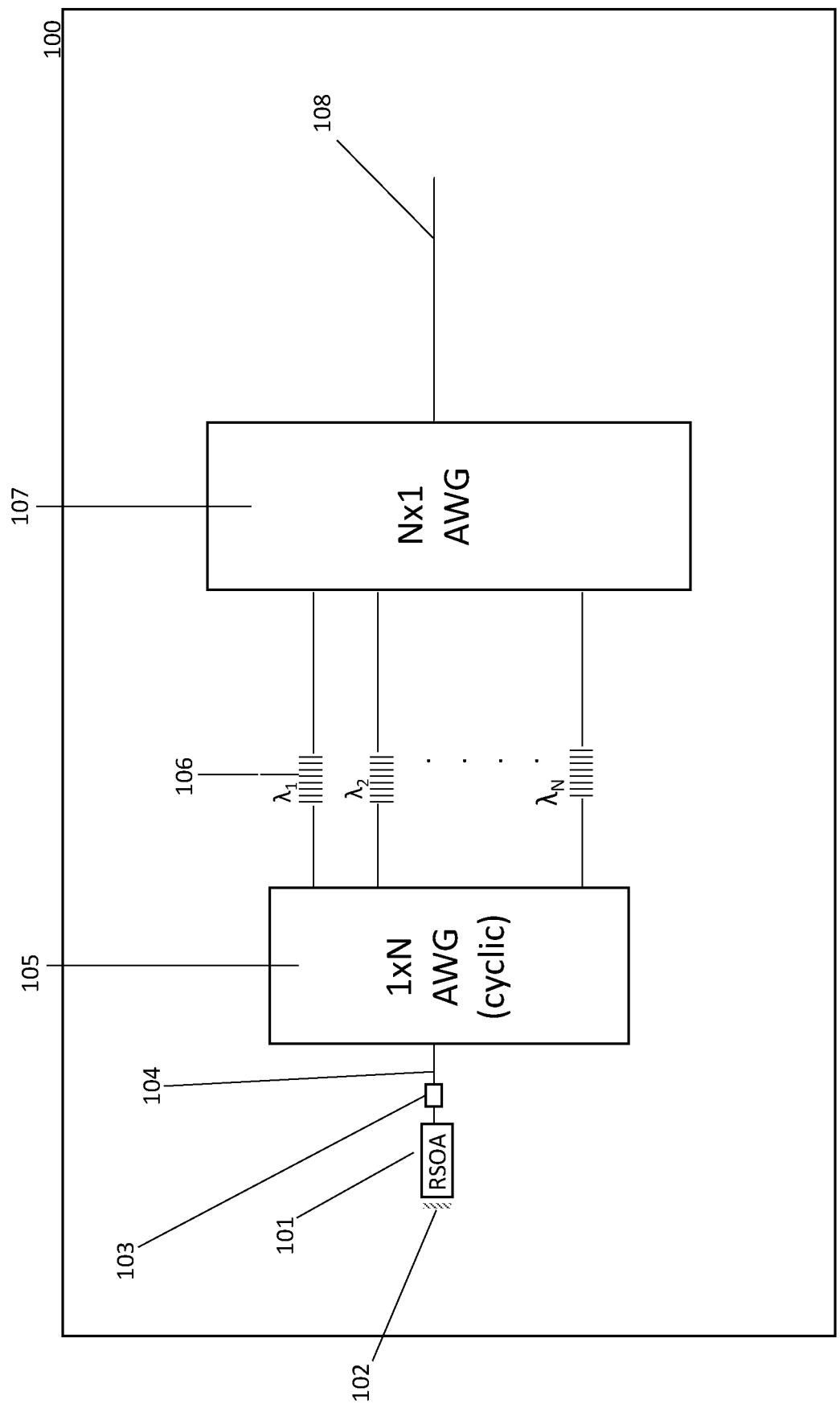
FIG. 1a shows a schematic diagram of a discrete wavelength tunable laser.

A first embodiment of a discrete wavelength tunable laser 100 is described with reference to FIGS. 1a and 1b. The discrete wavelength tunable laser 100 includes a semiconductor optical amplifier (SOA) reflective semiconductor optical amplifier (RSOA) 101 which generates light over a given gain bandwidth. The back surface of the RSOA 102 includes a high reflectivity mirror at 102 forming back end mirror of the optical cavity of the tunable laser.

The tunable laser includes an Arrayed Waveguide Grating (AWG) 105 in the form of a 1×N AWG which has a single input optically coupled to the output of the RSOA via a waveguide 104. A phase tuner 103 is located at the waveguide 104 for fine tuning of the wavelength.

The AWG has N outputs, each of which transmits or passes a respective fixed spectral passband, each of which lies within the gain bandwidth of the RSOA.

A plurality N of waveguides are each optically coupled to a respective one of the N outputs of the 1×N AWG. Each output waveguide therefore corresponds to a particular wavelength channel of the AWG.

Each of the N output waveguides includes a tunable distributed Bragg reflector (DBR) grating 106 and each DBR is configured to be able to select the spectral passband of that waveguide (cause a back-reflection within the spectral passband of that waveguide) upon application of a bias current.

The reflection peak of each tunable DBR is slightly detuned from the wavelength channel for the waveguide 106 at which it is located when no bias is applied. When a bias is applied to the DRB grating to select that channel, the resulting phase change means that the reflection peak of the grating becomes tuned at or near to the center wavelength of that channel, and the grating becomes the front end mirror of an optical comprising that waveguide, creating a laser. The lasing channel (i.e. one of the possible lasing modes of the laser) of the discrete wavelength tunable laser is therefore chosen by the overlap of the reflection band of a given DBR with a fixed spectral pass-band of the AWG.

Each of tunable DBRs includes a pn junction and electrical connections including a drive circuit and drive pins which provide an electrical contact between the drive circuit and the pn junction. By applying a bias from the drive circuit, the DBR is configured such that it can be switched to its "on" wavelength by application of a single set voltage. In the "off" state the wavelength of the gratings 106 corresponds with a high-loss off-band wavelength of the AWG 105. In the "on" state the reflection wavelength of the DBR corresponds to one of the spectral pass-bands of the AWG. The resulting overlap enables the optical cavity to lase at the selected wavelength. Only one of the gratings 106 will be on at a given time. When a DBR 106 is "selected", it forms the front end mirror of the optical cavity.

Figure 1B:
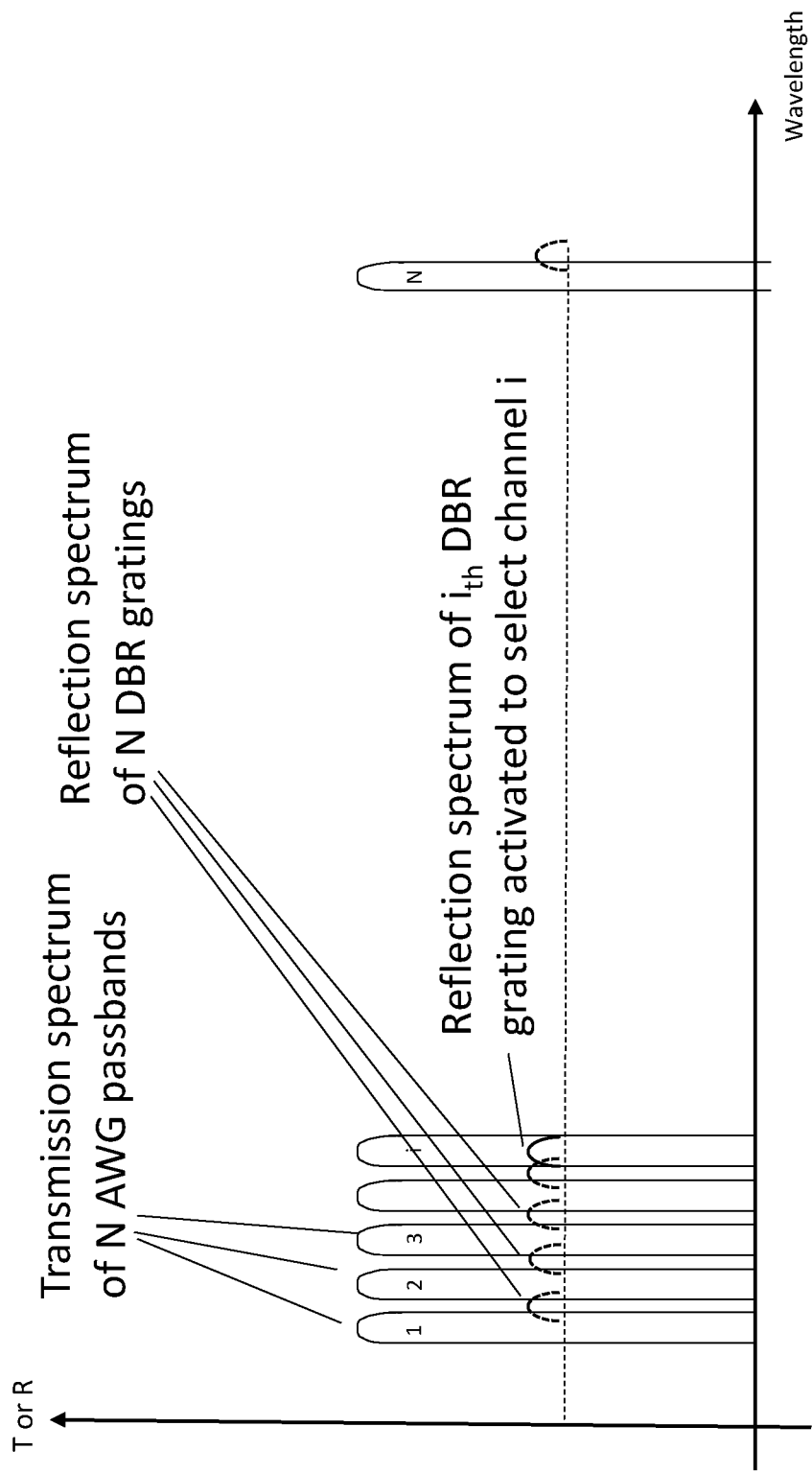

The activation of a required wavelength channel (i.e. lasing wavelength of the laser) can be seen in more detail in FIG. 1b in which the required channel "I" is activated because the transmission spectrum of the ith one of the N passbands of the AWG overlaps spectrally with the reflection spectrum of the selected one of the N DBR gratings.

The output of the laser light is directed to a single output waveguide by connecting the channelized output waveguides to a multiplexer. In FIG. 1 this multiplexor takes the form of an N×1 AWG 107 although other types of multiplexers may be used.

The phase tuner 103 provides fine tuning and therefore seeks to provide a mechanism to counter wavelength drift over the lifetime of the tunable laser. In the example shown in FIG. 1, N may be 48, the gratings 106 may have reflectivity of 10%, and the channel spacing of the AWG may be 100 GHz. The advantage of this embodiment is that one commercially available RSOA powers all channels, for example all 48 channels. In general the tolerance to aging of this design is also advantageously high.

The AWG of this embodiment and the AWGs of embodiments described below may be fabricated integrally with the other features (waveguides) or may be fabricated as a separate chip and aligned during assembly with the waveguides on the silicon chip.

The AWG 105 may be an integrated part of the optical chip (100) or may be a separate device. The optical chip 100 may optionally be fabricated in silicon such as silicon-on-insulator.

Two further embodiments of discrete wavelength tunable lasers 300a and 300b are described below with reference to FIGS. 2a and 2b.

Each discrete wavelength tunable laser 300a, 300b comprises an RSOA 301 with a highly reflective back facet 302.

Figure 2A:
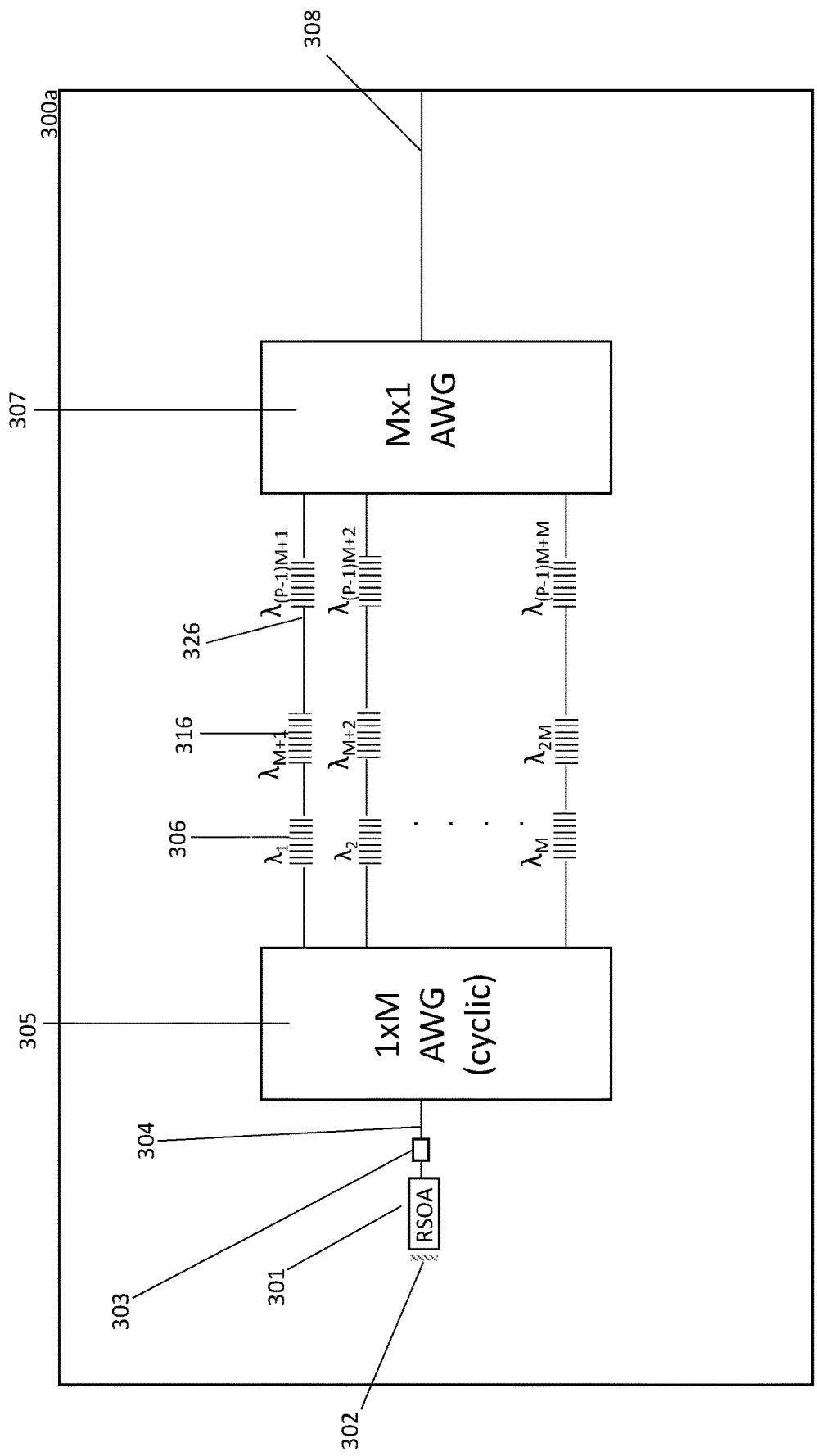
FIG. 2a shows a schematic diagram of an alternative discrete wavelength tunable laser.

In the embodiment 300a shown in FIG. 2a, the RSOA is optically coupled to a 1×M AWG 305 and the M output waveguides of this AWG include DS-DBR gratings located therewith. In FIG. 2a, the AWG 305 is a cyclic AWG with at least P cycles, has a channel spacing of $\Delta f$, where $\Delta f$ is the tunable laser grid channel spacing, and an FSR of $M*\Delta f$. The DS-DBR gratings on each of the waveguides 1 to M are fabricated to have P reflecting wavelength states, the first waveguide having wavelength values 1, M+1, 2M+1, etc up to (P−1)M+1, the second waveguide having values 2, M+2, 2M+2, etc. up to (P−1)M+2, and the last waveguide having values M to PM (since (P−1)M+M=MP) where P is N/M, and N is the number of total wavelength states of the tunable laser.

For example, if P=7, there would be 7 grating wavelengths available per waveguide, and 7 sections to each DS-DBR grating. In other words, there would be 7 grating wavelengths available to be selected on for each spectral passband of the AWG. If M is 7, then there are 49 total modes corresponding to 49 wavelength channels available for the tunable laser. When a wavelength is selected on a DS-DBR, the DS-DBR becomes reflective at that wavelength so that the optical cavity of the laser is formed between the reflector 302 of the RSOA and the selected DS-DBR.

Figure 2B:
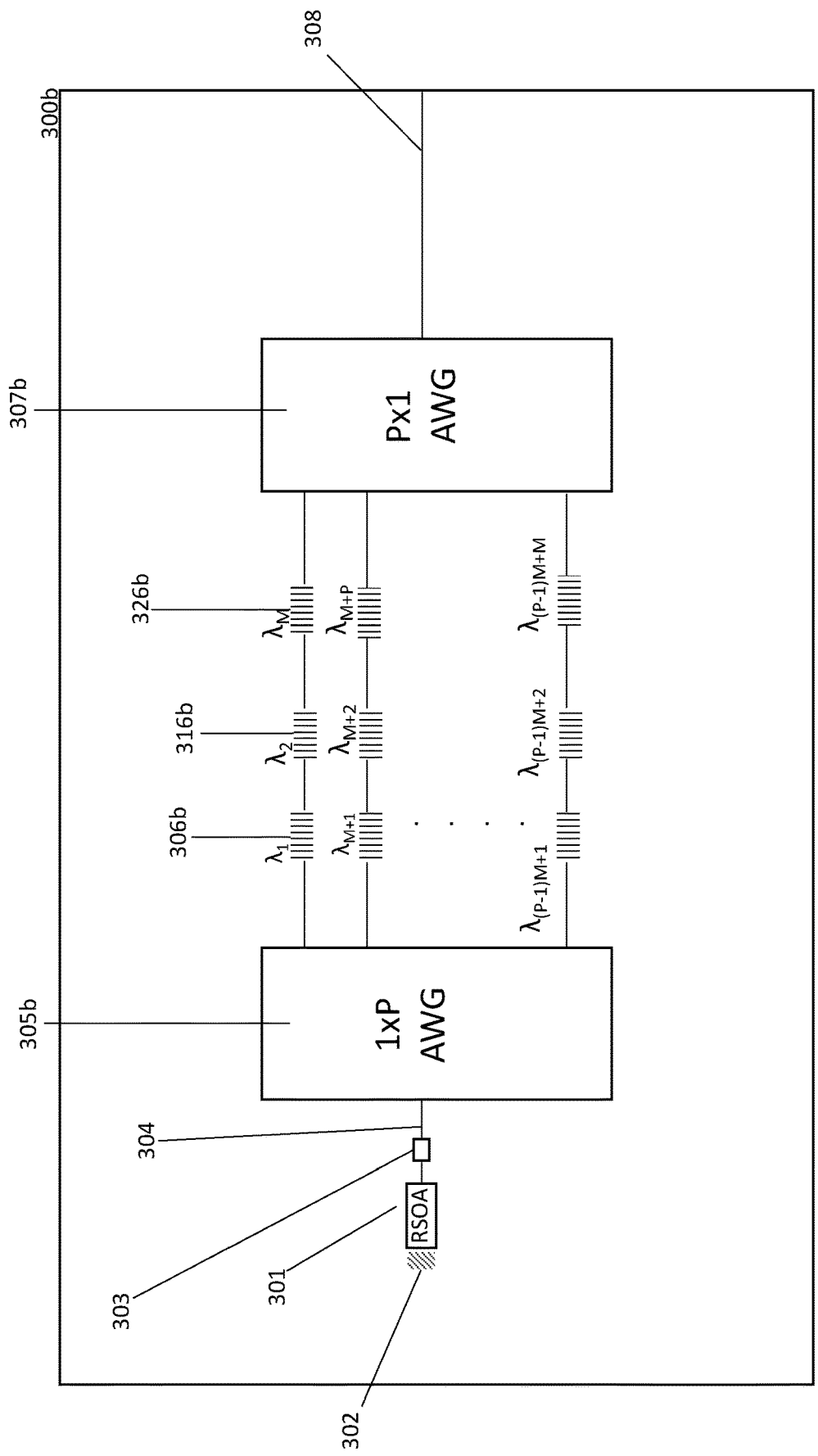
FIG. 2b shows a schematic diagram of an alternative discrete wavelength tunable laser.

The embodiment shown in FIG. 2b differs from that of 2a in that the 1×M AWG 305 of FIG. 2a is replaced by a non-cyclic 1×P AWG 305b.

A non-cyclic AWG can be advantageous in that the losses for the "worst case channel" of the AWG can be made to be lower. The transmission losses through the channels at the edges of an AWG's FSR are typically higher, and in a cyclic AWG the channels at the edges of the FSR must be used. With a non-cyclic AWG, the FSR can be designed to be significantly larger than the bandwidth of the channels that are used, so that the channels that are used are in the center of the FSR and therefore have a lower loss.

On the other hand, the use of cyclic AWGs can be advantageous over non-cyclic AWGs because when using a non-cyclic AWG for this purpose the individual channel transmission bands must each have pass band width of M*Δf, and the P pass bands must pass all P*M channels, therefore the passbands must have transmission spectra that are close to square-shaped (thereby leading to a constant loss across all wavelengths being passed, and high isolation of all other wavelengths). For example, AWG channel 1 must pass all sub-channels 1 to M with little loss variation, and reject all other sub-channels, and AWG channel 2 must pass all sub-channels M+1 to 2M with little loss variation, and reject all other sub-channels. However such difficulties can be mitigated if the wavelength grid used by the system is allowed to have gaps between each group of M wavelength combs.

In the embodiment of FIG. 2b, the AWG 305b is a P-channel AWG with a channel spacing of MΔf, and a 3-dB channel transmission spectrum bandwidth sufficient to pass M channels of Δf channel spacing. The DS-DBR gratings on waveguides 1 to P are fabricated to have M reflecting wavelength states, the first waveguide having wavelength values 1, 2, . . . M, the second having values M+1, M+2, . . . M+P, the third waveguide having wavelength values 2M+1, 2M+2, . . . 2M+P, and the last waveguide having wavelength values (P−1)M+1, (P−1)M+2, . . . (P−1)M+M, which is equal to PM.

Figure 2C:
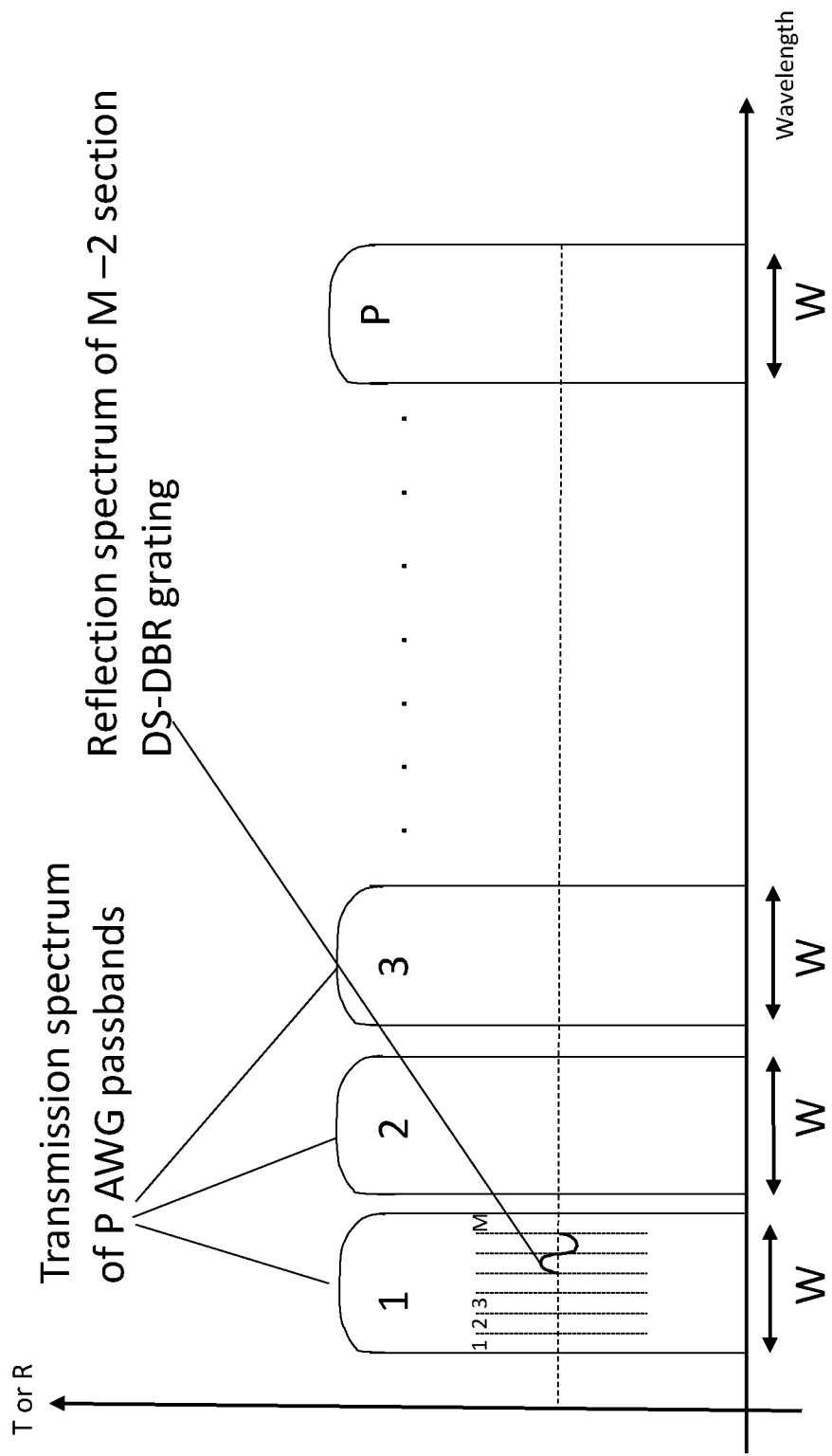
FIG. 2c shows a schematic diagram of spectral profiles of the AWGs and DS-DBRs of the embodiment shown in FIG. 2b.

FIG. 2c shows example transmission spectra of the P AWG channels of the AWG outputs shown in FIG. 2b, each output channel of the AWG having a spectral range "W" which lies within the bandwidth of the SOA. FIG. 2c also shows example reflection spectra of the M-section DS-DBR gratings on each of the P waveguides.

The selection of the wavelength channel M−2 is shown. This occurs when section M−2 of a DS-DBR is selected on the first waveguide by a bias voltage applied to electrode M−2 on the DS-DBR grating on the waveguide of AWG channel 1. In this way, the laser mode M−2 is selected out of M×P discrete modes available for this discrete-mode tunable laser. In some embodiments (not shown), rather than selecting the desired lasing channel by applying a bias directly to the section of the DBR corresponding to that channel, the section may be "selected" by applying a bias of the opposite polarity to a section immediately adjacent to the desired section.

An alternative discrete wavelength tunable laser 400 is described below with reference to FIG. 3. The embodiment shown in FIG. 3 differs from that shown in FIGS. 1a and 1b in that the AWG is actually made up of two separate AWG stages; a first coarse AWG stage 405 and a second fine tuning AWG stage 409. The overall transmission function of the combination of AWGs 405 and 409 is the same or similar to the transmission function of AWG 105 in FIG. 1.

The coarse tuning AWG 405 takes the form of a 1×P AWG, having one input which is optically coupled to the RSOA on its input side and optically connected to a plurality P of output waveguides on its output side. The 1×P AWG itself passes a range of spectral passbands across each of its P respective outputs.

The fine tuning AWGs 409 each take the form of a 1×M AWG. The input of each of the 1×M AWG is optically coupled to one of the P respective outputs of the 1×P AWG and the M outputs are each optically coupled to an output waveguide. Each of the M output waveguides includes a tunable DBR grating.

Unlike the embodiments of FIGS. 2a and 2b, each selectable wavelength channel of the AWG has its own single-section grating. The single-section DBRs are much simpler to manufacture than the DS-DBR gratings of FIGS. 2a and 2b. The size of the 1×M and 1×P AWGs combined can be made to be smaller than a single 1×N grating. Therefore the size of the device of this embodiment can be less than that in FIG. 1, but will still be larger than those in FIGS. 2a and 2b.

Figure 3:
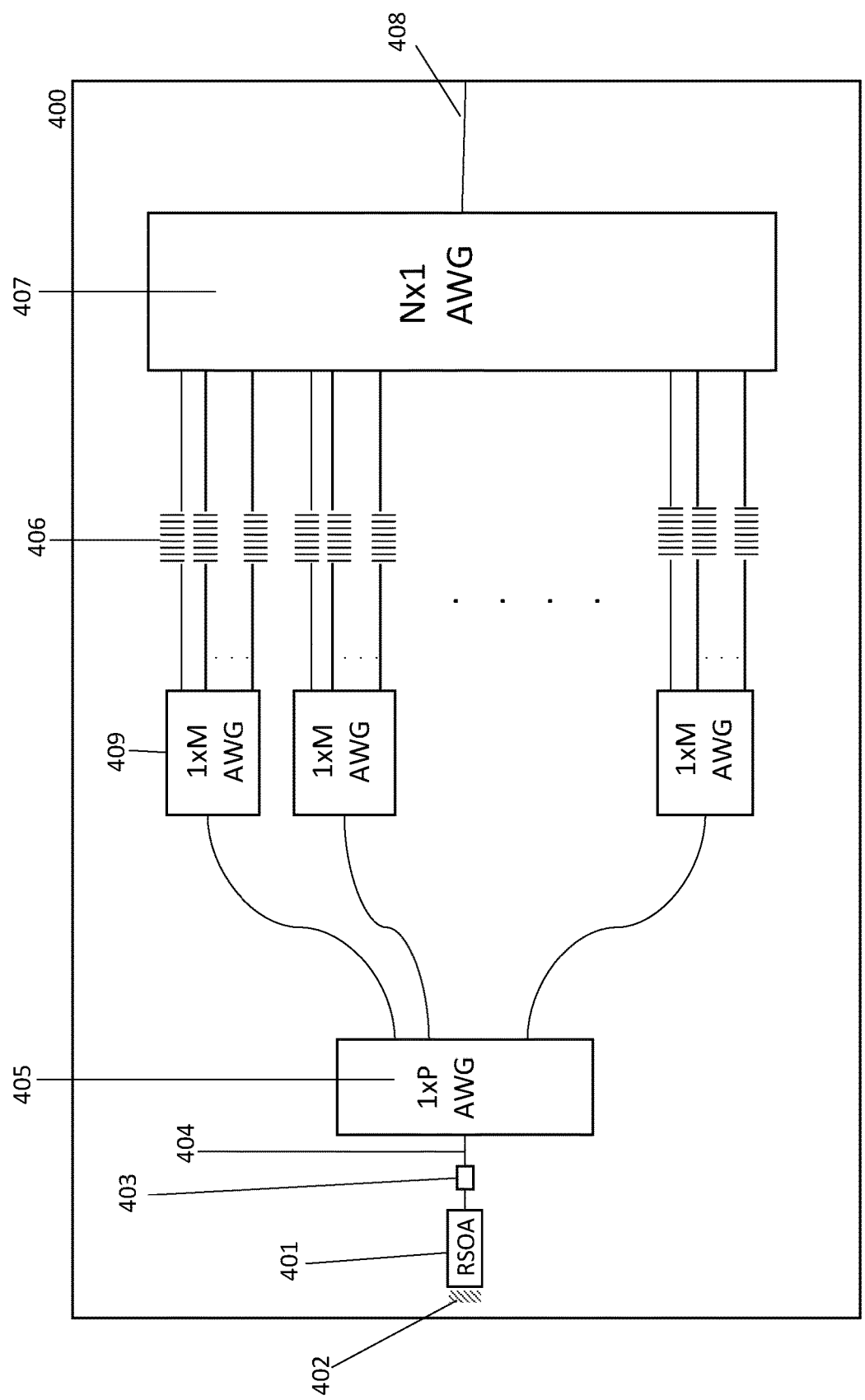
FIG. 3 shows a schematic diagram of an alternative discrete wavelength tunable laser.

In an alternative embodiment of FIG. 3, the location of the coarse and fine AWGs may be swapped so that AWG 405 is a cyclic AWG and gives a fine wavelength selection, in the same way as the 1×M cyclic AWG in FIG. 2a, and AWGs 409 give coarse wavelength selection.

The discrete wavelength tunable laser 400 includes a further N×1 AWG 407 which acts as a multiplexer to multiplex the signals from the M×P respective output waveguides to produce a common output of the laser.

Figure 4:
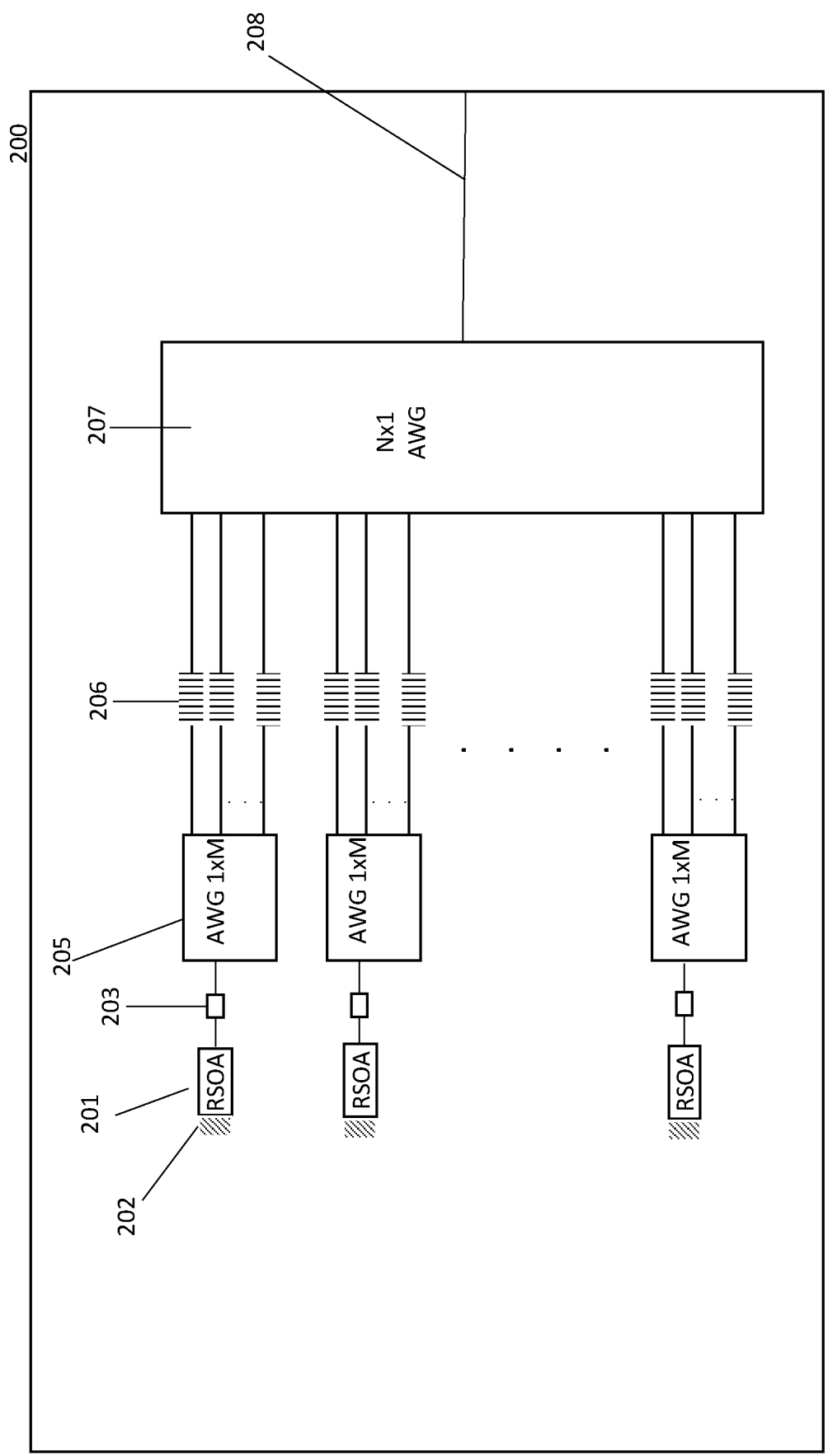
FIG. 4 shows a schematic diagram of an alternative discrete wavelength tunable laser.

FIG. 4 shows a schematic diagram of an embodiment containing multiple RSOAs coupled to multiple respective AWGs.

For the same discrete wavelength states for the tunable laser as previous embodiments, the lasing cavities are divided amongst a plurality P of RSOAs, each RSOA having the same gain bandwidth in the case where the RSOAs are an array of RSOA waveguides on a single chip coming from the same wafer, or, alternatively, having different gain bandwidths optimized for its corresponding downstream AWG, in the case where the ROSA are different chips. In the embodiment shown, an RSOA 201 generates optical power for M lasing wavelengths using a downstream 1×M AWG. Each 1×M AWG is designed to pass a comb with a channel spacing of M*Δf, the first AWG passing wavelength values 1, 2, . . . M, the second passing values M+1, M+2, . . . 2M, the third passing wavelength values 2M+1, 2M+2, . . . 3M, etc., and the last waveguide having wavelength values (P−1)M+1, (P−1)M+2, . . . PM. The 1×M AWGs are thus designed the same as the AWGs 409 in FIG. 3.

As in the previous embodiments, the M outputs from the lasers from all of the AWGs 205 are combined using an N×1 multiplexer 207, which acts to multiplex the signals from the M×P respective output waveguides to produce a common output of the laser.

Compared with the embodiment in FIG. 3, the first 1×P AWG is replaced with RSOAs, thus the optical path length of the laser cavities is shorter and so tuning speed is faster and laser mode spacing larger, but this is achieved at the cost of a plurality of RSOAs. Additionally, if the laser is to be power efficient, only the RSOA that provides gain for the laser mode being selected should be powered on during the time that mode is selected, and all other RSOAs should be powered off. This adds additional complexity to the tuning electronics. For a 49-wavelength output laser, P could be 7 and the number of RSOAs would be 7. In this embodiment the whole device could be integrated on one chip or it could be constructed from several chips. The chip and chips could be SOI.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For example, in some embodiments described herein, the AWG is used to give a wavelength filter function (i.e. as a wavelength demultiplexer). However, AWGs with coarse filter functions can be difficult to design and manufacture. As an alternative, Mach-Zehnder (MZ) interferometers such as Mach-Zehnder waveguide interferometers may be used. When constructed in a cascade, with differing phase changes in the arms of each MZ in the cascade, such MZs can be made into a useful coarse filter with square-like pass-band shapers. Echelle gratings could also be used in place of any of the AWGs.

Whilst the embodiments described herein all comprise a reflective semiconductor optical amplifier (RSOA), it is envisaged that they could all be carried out using a standard SOA (without a mirrored surface). In this case, the SOA would be a double sided structure and both sides would need to be coupled to the SOI host chip. A separate rear mirror (not part of the SOA) would need to be fabricated to be optically coupled to the back side of the SOA.

All references referred to above are hereby incorporated by reference.

The invention claimed is:

1. A discrete wavelength tunable laser having an optical cavity which comprises:
   a semiconductor optical amplifier (SOA);
   a wavelength demultiplexer (Demux) having a single input and a plurality of outputs, the Demux configured to receive the output of the SOA and to produce a plurality of different fixed spectral passbands within the gain bandwidth of the SOA;
   one or more tunable distributed Bragg reflector(s) (DBR(s)) arranged to receive the outputs of the Demux, each tunable DBR configured to select a reflective spectral band within the gain bandwidth of the SOA upon application of a bias current; and
   a back end mirror,
   wherein the one or more tunable DBRs form the front end mirror of the optical cavity;
   wherein the SOA is between the back end mirror and the Demux; and
   wherein the lasing channel of the discrete wavelength tunable laser is chosen by the overlap of the selected reflective spectral band of one of the one or more tunable DBRs with a fixed spectral passband of the Demux.

2. The discrete wavelength tunable laser of claim 1, wherein:
   a single waveguide optically couples the output of the SOA to the input of the Demux;
   the discrete wavelength tunable laser comprises further waveguides, each of which is optically coupled to a respective output of the Demux; and
   wherein each of the further waveguides includes a respective one of the one or more tunable DBRs.

3. The discrete wavelength tunable laser of claim 1, wherein the Demux is an Arrayed Waveguide Grating (AWG).

4. The discrete wavelength tunable laser of claim 3, wherein:
   the AWG is a 1×N AWG which splits the spectral output of the SOA into an integer number N of respective output waveguides; and
   wherein the discrete wavelength tunable laser includes a further AWG which acts as a multiplexer to multiplex the signals from the N respective output waveguides to produce a common output of the laser.

5. The discrete wavelength tunable laser of claim 3, wherein:
   the AWG is a first 1×M AWG which splits the spectral output of the SOA into an integer number M of respective output waveguides;
   the discrete wavelength tunable laser includes a further AWG which acts as a multiplexer to multiplex the signals from the M respective output waveguides to produce a common output of the laser; and
   wherein each respective waveguide includes one or more tunable DBRs the one or more tunable DBRs on each waveguide having a total number of P reflecting wavelength states.

6. The discrete wavelength tunable laser of claim 5, wherein the first 1×M AWG is a cyclic AWG wavelength router.

7. The discrete wavelength tunable laser of claim 5 wherein the first 1×M AWG has a channel spacing of $\Delta f$ and an FSR of $M\Delta f$.

8. The discrete wavelength tunable laser of claim 3, wherein:
   the AWG is a non-cyclic 1×P AWG which splits the spectral output of the SOA into an integer number P of respective output waveguides;
   wherein the discrete wavelength tunable laser includes a further AWG which acts as a multiplexer to multiplex the signals from the P respective output waveguides to produce a common output of the laser; and
   wherein each respective waveguide includes one or more tunable DBRs, the one or more tunable DBRs on each waveguide having a total number of M reflecting wavelength states.

9. The discrete wavelength tunable laser of claim 3, wherein the Arrayed Waveguide Grating (AWG) configured to receive the output of the SOA and to produce a plurality of fixed spectral passbands within the gain bandwidth of the SOA is a plurality of AWGs including:
   a coarse tuning AWG in the form of a 1×P AWG, having one input which is optically coupled to the SOA and P outputs, the 1×P AWG configured to output a range of spectral passbands to each of its P respective outputs;

a plurality of fine tuning AWGs, where each fine tuning AWG is a 1×M AWGs; the input of each of the 1×M AWG being optically coupled to one of the P respective outputs of the 1×P AWG;

M output waveguides respectively coupled to the M outputs of each fine tuning AWG to give a total of M×P output waveguides from the 1×M AWGs; and a further AWG which acts as a multiplexer to multiplex the signals from the M×P respective output waveguides to produce a common output of the laser, wherein each of the M output waveguides of each of the fine tuning AWGs comprises a respective one of the one or more tunable DBRs.

10. The discrete wavelength tunable laser of claim 1, wherein the SOA is a reflective semiconductor optical amplifier (RSOA) comprising the back end mirror.

11. The discrete wavelength tunable laser of claim 3, further comprising additional SOAs and additional AWGs such that the tunable laser includes:

a plurality of SOAs and a plurality 1×M AWGs, the output of each SOA providing an input to a 1×M AWG; and a plurality M of output waveguides optically coupled to each 1×M AWG, each of the M output waveguides optically coupled to a respective one of the M outputs of that 1×M AWG, wherein each of the M outputs of each 1×M AWG includes a respective one of the one or more tunable DBRs.

12. The discrete wavelength tunable laser of claim 1, wherein each of the one or more tunable DBR(s) is a digital supermode-distributed Bragg reflector (DS-DBR).

13. The discrete wavelength tunable laser of claim 11, wherein the plurality of SOAs are located on a single chip.

14. The discrete wavelength tunable laser of claim 11, wherein each of the plurality of SOAs are located on a different chip.

15. The discrete wavelength tunable laser of claim 11, wherein the plurality of SOAs are reflective semiconductor optical amplifiers (RSOAs).

* * * * *